(12) United States Patent
Kitabayashi

(10) Patent No.: US 9,646,834 B2
(45) Date of Patent: May 9, 2017

(54) METHOD FOR MANUFACTURING SEMICONDUCTOR DEVICE

(71) Applicant: Sumitomo Electric Industries, Ltd., Osaka-shi (JP)

(72) Inventor: Hiroyuki Kitabayashi, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 15/102,375

(22) PCT Filed: Oct. 21, 2014

(86) PCT No.: PCT/JP2014/077939
§ 371 (c)(1),
(2) Date: Jun. 7, 2016

(87) PCT Pub. No.: WO2015/087622
PCT Pub. Date: Jun. 18, 2015

(65) Prior Publication Data
US 2017/0018429 A1      Jan. 19, 2017

(30) Foreign Application Priority Data

Dec. 10, 2013  (JP) .................. 2013-255021

(51) Int. Cl.
*H01L 21/28* (2006.01)
*H01L 21/04* (2006.01)
(Continued)

(52) U.S. Cl.
CPC ...... *H01L 21/0485* (2013.01); *H01L 21/6836* (2013.01); *H01L 29/1608* (2013.01);
(Continued)

(58) Field of Classification Search
CPC .......... H01L 2924/0002; H01L 21/046; H01L 2924/00; H01L 29/66068; H01L 29/7802;
(Continued)

(56) References Cited

U.S. PATENT DOCUMENTS

2012/0225537 A1   9/2012   Horii
2013/0017671 A1   1/2013   Kitabayashi et al.
(Continued)

FOREIGN PATENT DOCUMENTS

WO   WO-2012/035880 A1   3/2012
WO   WO-2012/124190 A1   9/2012
(Continued)

OTHER PUBLICATIONS

International Search Report in PCT International Application No. PCT/JP2014/077939, dated Jan. 27, 2015.

*Primary Examiner* — Robert Bachner
(74) *Attorney, Agent, or Firm* — Venable LLP; Michael A. Sartori; F. Brock Riggs

(57) ABSTRACT

There are prepared a semiconductor substrate having a first main surface and a second main surface, and an adhesive tape having a third main surface and a fourth main surface, the first main surface having a maximum diameter of not less than 100 mm. The semiconductor substrate fixed to the third main surface of the adhesive tape is placed in an accommodation chamber. The accommodation chamber is evacuated while maintaining a temperature of the adhesive tape at not less than 100° C. An electrode is formed on the second main surface after the step of reducing the temperature of the semiconductor substrate. The step of evacuating the accommodation chamber includes a step of evacuating the accommodation chamber while maintaining the temperature of the adhesive tape at not less than 100° C. with a space being (Continued)

provided between the fourth main surface of the adhesive tape and the substrate holding unit.

14 Claims, 12 Drawing Sheets

(51) Int. Cl.
*H01L 21/683* (2006.01)
*H01L 29/16* (2006.01)
*H01L 29/66* (2006.01)

(52) U.S. Cl.
CPC *H01L 29/66068* (2013.01); *H01L 2221/6835* (2013.01); *H01L 2221/68327* (2013.01)

(58) Field of Classification Search
CPC ............. H01L 21/0485; H01L 21/6836; H01L 2221/68327; H01L 2221/6834; H01L 29/1608; H01L 21/0445; H01L 21/049; H01L 21/0495
See application file for complete search history.

(56) References Cited

U.S. PATENT DOCUMENTS

| | | |
|---|---|---|
| 2013/0143398 A1 | 6/2013 | Kitabayashi et al. |
| 2014/0001487 A1 | 1/2014 | Nakazawa et al. |

FOREIGN PATENT DOCUMENTS

| | | |
|---|---|---|
| WO | WO-2013/011759 A1 | 1/2013 |
| WO | WO-2013/080584 A1 | 6/2013 |

METHOD FOR MANUFACTURING SEMICONDUCTOR DEVICE

TECHNICAL FIELD

The present invention relates to a method for manufacturing a semiconductor device, more particularly, a method for manufacturing a semiconductor device to achieve reduced contact resistance between a semiconductor substrate and an electrode.

BACKGROUND ART

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

Examples of such a semiconductor device employing silicon carbide as its material includes a semiconductor device that conducts and interrupts current by controlling whether to form an inversion layer in a channel region based on a predetermined threshold voltage, such as a MOSFET (Metal Oxide Semiconductor Field Effect Transistor).

For example, WO 2012/035880 (Patent Document 1) describes a method for manufacturing a semiconductor device using a silicon carbide substrate. According to the method for manufacturing the semiconductor device, a combined wafer is prepared in which a plurality of silicon carbide substrates are connected to each other by a supporting layer, then a surface electrode is formed on one surface of the combined wafer, and an adhesive tape is adhered in contact with the surface electrode. The supporting layer is ground while supporting the plurality of silicon carbide substrates by the adhesive tape, thereby removing the supporting layer. Next, a backside electrode is formed on the silicon carbide substrate with the silicon carbide substrate being fixed by the adhesive tape.

CITATION LIST

Patent Document

PTD 1: WO 2012/035880

SUMMARY OF INVENTION

Technical Problem

However, when an electrode is formed on a semiconductor substrate with the semiconductor substrate being fixed by an adhesive tape, contact resistance between the semiconductor substrate and the electrode may become large.

The present invention has been made in view of the above problem, and has an object to provide a method for manufacturing a semiconductor device to achieve reduced contact resistance between a semiconductor substrate and an electrode.

Solution to Problem

A method for manufacturing a semiconductor device according to the present invention includes the following steps. A semiconductor substrate, an adhesive tape, and a substrate holding unit are prepared, the semiconductor substrate having a first main surface and a second main surface opposite to the first main surface, the first main surface having a maximum diameter of not less than 100 mm, the adhesive tape having a third main surface and a fourth main surface opposite to the third main surface, the substrate holding unit being provided to be capable of holding the semiconductor substrate. The first main surface of the semiconductor substrate is fixed to the third main surface of the adhesive tape. The semiconductor substrate fixed to the third main surface of the adhesive tape is placed in an accommodation chamber. The accommodation chamber is evacuated while maintaining a temperature of the adhesive tape at not less than 100° C. A temperature of the semiconductor substrate is reduced after the step of evacuating the accommodation chamber. An electrode is formed on the second main surface of the semiconductor substrate after the step of reducing the temperature of the semiconductor substrate. The step of evacuating the accommodation chamber includes a step of evacuating the accommodation chamber while maintaining the temperature of the adhesive tape at not less than 100° C. with a space being provided between the fourth main surface of the adhesive tape and the substrate holding unit.

Advantageous Effects of Invention

According to the present invention, there can be provided a method for manufacturing a semiconductor device to achieve reduced contact resistance between a semiconductor substrate and an electrode.

DESCRIPTION OF EMBODIMENTS

Figure 1:
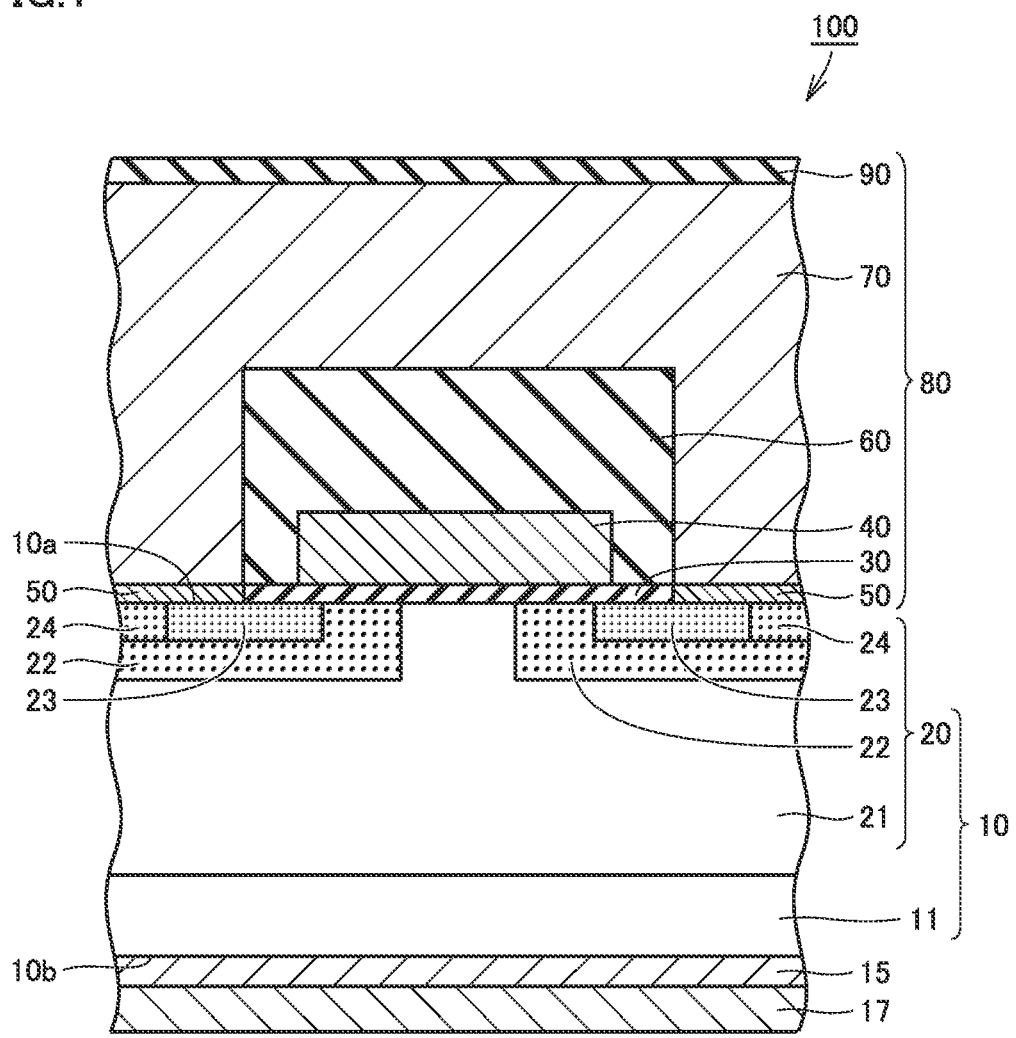
FIG. 1 is a schematic cross sectional view schematically showing a configuration of a semiconductor device according to one embodiment of the present invention.

[Description of Embodiment of the Invention of the Present Application]

The following describes an embodiment of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ) and a group plane is represented by { }. In addition, a negative index is supposed to be crystallographically indicated by putting "–" (bar) above a numeral, but is indicated by putting the negative sign before the numeral in the present specification. For description of an angle, a system in which an omnidirectional angle is 360° is employed.

The inventors diligently studied a cause of large contact resistance between a semiconductor substrate and an electrode when forming the electrode on the semiconductor substrate with the semiconductor substrate being fixed to an adhesive tape. As a result, the inventors obtained the following knowledge and arrived at the present invention.

For example, when forming a metal film on a semiconductor substrate by sputtering or the like with the semiconductor substrate being fixed to an adhesive tape, the temperature of the adhesive tape having the semiconductor substrate fixed thereto is increased. When the temperature of the adhesive tape is increased, an impurity gas is emitted from the adhesive tape, with the result that the metal film formed on the semiconductor substrate is oxidized by the impurity gas. Then, when the metal film is annealed to form an electrode, contact resistance between the semiconductor substrate and the electrode is found to be increased.

Moreover, also in the case where a protecting electrode is formed on the electrode, it was found that an interface between the electrode and the protecting electrode is oxidized by the impurity gas, with the result that adhesion between the electrode and the protecting electrode may be deteriorated. As a result of analysis on components of the impurity gas, it was found that the main component of the impurity gas is $H_2O$ (water vapor). When the water vapor reacts with the metal film, the metal film is considered to be oxidized. In view of this, the inventors conceived to place a semiconductor substrate fixed to the adhesive tape in an accommodation chamber and evacuate the accommodation chamber while maintaining the temperature of the adhesive tape at not less than 100° C. Accordingly, water contained in or adhered to the adhesive tape is vaporized into water vapor and the water vapor is exhausted from the accommodation chamber, thereby removing the water vapor around the semiconductor substrate. As a result, the electrode can be suppressed from being oxidized by the water vapor, thereby reducing contact resistance between the semiconductor substrate and the electrode. Moreover, adhesion between the electrode and the protecting electrode can be improved.

As the research was further continued, it was found that a semiconductor substrate fixed to an adhesive tape may be cracked when the semiconductor substrate is heated at not less than 100° C. Moreover, a semiconductor substrate having a larger diameter is more likely to be cracked, and a semiconductor substrate having a diameter of not less than 100 mm is particularly noticeably likely to be cracked. The inventors conducted a detailed research on a cause of the crack of semiconductor substrate and considered that the crack of semiconductor substrate is mainly caused by heating each of the adhesive tape and the semiconductor substrate with the semiconductor substrate being fixed to a substrate holding unit with the adhesive tape being interposed therebetween.

Figure 22:
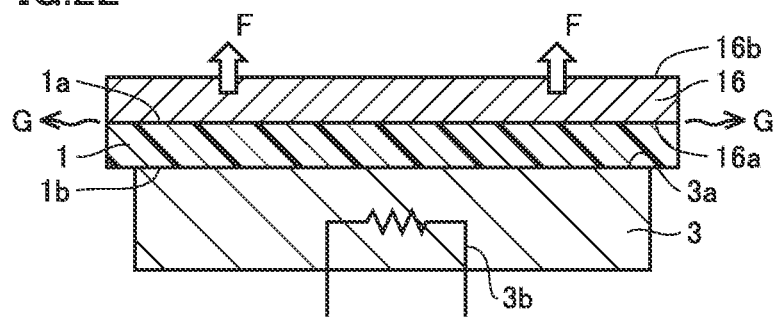
FIG. 22 is a schematic view schematically showing a state in which gas is removed when performing a degassing heat treatment with the semiconductor substrate being fixed to the substrate holding unit with an adhesive tape interposed therebetween.

With reference to FIG. 22, a semiconductor substrate 16 is adsorbed to a substrate holding unit 3 with an adhesive tape 1 being interposed therebetween. Substrate holding unit 3 includes a heater 3b. When substrate holding unit 3 is heated using heater 3b, the heat is conducted from substrate holding unit 3 to adhesive tape 1 and semiconductor substrate 16, thereby heating adhesive tape 1 and semiconductor substrate 16. When each of adhesive tape 1 and semiconductor substrate 16 is heated at a temperature of, for example, not less than 100° C., gas G is generated between adhesive tape 1 and semiconductor substrate 16. The main component of gas G is water vapor. Gas G thus generated travels, via a space between adhesive tape 1 and semiconductor substrate 16, in a direction from the center of first main surface 16a of semiconductor substrate 16 toward the outer circumference thereof.

As shown in FIG. 22, when semiconductor substrate 16 is fixed to substrate holding unit 3 via adhesive tape 1, the gas intermittently generated from between semiconductor substrate 16 and adhesive tape 1 partially pushes up semiconductor substrate 16 in a direction of arrows F. As a result, a portion of semiconductor substrate 16 is partially vibrated, thereby greatly deforming semiconductor substrate 16. This results in crack of semiconductor substrate 16. Moreover, as the diameter of first main surface 16a of semiconductor substrate 16 is larger, an amount of gas G generated is also increased. Further, when the diameter of first main surface 16a of semiconductor substrate 16 is larger, a distance from the center to the outer circumference becomes longer, with the result that gas G is unlikely to be removed. Accordingly, when the diameter of first main surface 16a of semiconductor substrate 16 is larger, semiconductor substrate 16 is more likely to be cracked particularly.

Figure 23:
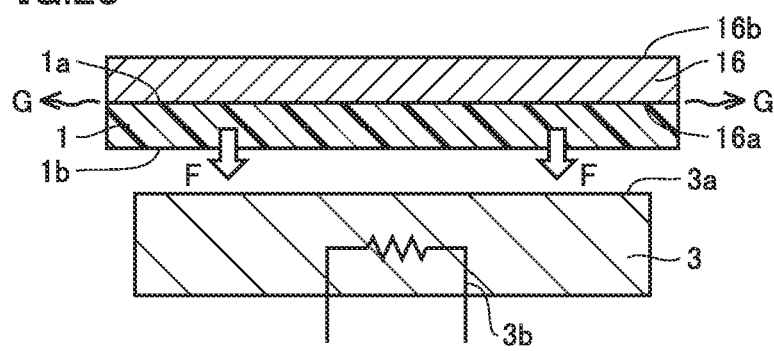
FIG. 23 is a schematic view schematically showing a state in which gas is removed when performing a degassing heat treatment with the adhesive tape and the semiconductor substrate being spaced away from the substrate holding unit.

On the other hand, as shown in FIG. 23, in the case where semiconductor substrate 16 fixed to adhesive tape 1 is provided to be spaced away from substrate holding surface 3a of substrate holding unit 3, gas G functions to push down adhesive tape 1 having flexibility higher than that of semiconductor substrate 16 when gas G is removed from between semiconductor substrate 16 and adhesive tape 1. Accordingly, adhesive tape 1 is deformed, so that gas G can be removed from between first main surface 16a of semiconductor substrate 16 and third main surfaces 1a of adhesive tape 1 without deforming semiconductor substrate 16 greatly. As a result, it is considered that semiconductor substrate 16 can be suppressed from being cracked.

(1) A method for manufacturing a semiconductor device according to an embodiment includes the following steps. A semiconductor substrate 16, an adhesive tape 1, and a substrate holding unit 3 are prepared, semiconductor substrate 16 having a first main surface 16a and a second main surface 16b opposite to first main surface 16a, first main surface 16a having a maximum diameter of not less than 100 mm, adhesive tape 1 having a third main surface 1a and a fourth main surface 1b opposite to third main surface 1a, substrate holding unit 3 being provided to be capable of holding semiconductor substrate 16. First main surface 16a of semiconductor substrate 16 is fixed to third main surface 1a of adhesive tape 1. Semiconductor substrate 16 fixed to third main surface 1a of adhesive tape 1 is placed in an accommodation chamber 31. Accommodation chamber 31 is evacuated while maintaining a temperature of adhesive tape 1 at not less than 100° C. A temperature of semiconductor substrate 16 is reduced after the step of evacuating accommodation chamber 31. An electrode 15 is formed on second main surface 16b of semiconductor substrate 16 after the step of reducing the temperature of semiconductor substrate 16. The step of evacuating accommodation chamber 31 includes a step of evacuating accommodation chamber 31 while maintaining the temperature of adhesive tape 1 at not less than 100° C. with a space being provided between fourth main surface 1b of adhesive tape 1 and substrate holding unit 3.

According to the method for manufacturing the semiconductor device according to the embodiment, semiconductor substrate 16 fixed to third main surface 1a of adhesive tape 1 is placed in accommodation chamber 31, and accommodation chamber 31 is evacuated while maintaining the temperature of adhesive tape 1 at not less than 100° C. Accordingly, water contained in or adhered to adhesive tape 1 is vaporized into water vapor and the water vapor is exhausted from accommodation chamber 31, thereby removing the water vapor around semiconductor substrate 16. In this way, electrode 15 formed on semiconductor substrate 16 can be suppressed from being oxidized by the water vapor. As a result, contact resistance between semiconductor substrate 16 and electrode 15 can be reduced. Moreover, in the step of evacuating accommodation chamber 31, accommodation chamber 31 is evacuated while maintaining the temperature of adhesive tape 1 at not less than 100° C. with a space being provided between fourth main surface 1b of adhesive tape 1 and substrate holding unit 3. Hence, the water vapor can be exhausted from between first main surface 16a of semiconductor substrate 16 and third main surfaces 1a of adhesive tape 1 without deforming semiconductor substrate 16 greatly. As a result, semiconductor substrate 16 can be suppressed from being cracked.

(2) Preferably in the method for manufacturing the semiconductor device according to (1), the step of evacuating accommodation chamber 31 includes a step of evacuating accommodation chamber 31 while maintaining the temperature of adhesive tape 1 at not less than 100° C. with fourth main surface 1b of adhesive tape 1 being in contact with substrate holding unit 3, after the step of evacuating accommodation chamber 31 while maintaining the temperature of adhesive tape 1 at not less than 100° C. with the space being provided between fourth main surface 1b of adhesive tape 1 and substrate holding unit 3. Accordingly, adhesive tape 1 is heated while being pressed by semiconductor substrate 16, thereby effectively removing water vapor remaining between first main surface 16a of semiconductor substrate 16 and third main surface 1a of adhesive tape 1.

(3) Preferably in the method for manufacturing the semiconductor device according to (1) or (2), substrate holding unit 3 includes a heater 3b provided to be capable of heating each of semiconductor substrate 16 and adhesive tape 1. Space t is maintained at not less than 0.5 mm and not more than 2.0 mm in the step of evacuating accommodation chamber 31 while maintaining the temperature of adhesive tape 1 at not less than 100° C. with the space being provided between fourth main surface 1b of adhesive tape 1 and substrate holding unit 3. When space t is not less than 0.5 mm, adhesive tape 1 is sufficiently deformed, so that water between first main surface 16a of semiconductor substrate 16 and third main surface 1a of adhesive tape 1 can be effectively removed. Moreover, when space t is not more than 2.0 mm, the temperature of each of adhesive tape 1 and semiconductor substrate 16 can be increased to a temperature at which water can be vaporized.

(4) Preferably the method for manufacturing the semiconductor device according to any one of (1) to (3) further includes a step of grinding second main surface 16b of semiconductor substrate 16 after the step of fixing first main surface 16a of semiconductor substrate 16 to third main surface 1a of adhesive tape 1 and before the step of evacuating accommodation chamber 31 while maintaining the temperature of adhesive tape 1 at not less than 100° C. Accordingly, semiconductor substrate 16 can be reduced to a desired thickness.

(5) Preferably in the method for manufacturing the semiconductor device according to (4), in the step of grinding second main surface 16b of semiconductor substrate 16, semiconductor substrate 16 is ground until semiconductor substrate 16 has a thickness of not more than 200 μm. When the thickness of semiconductor substrate 16 is small, semiconductor substrate 16 is particularly likely to be cracked. According to the method for manufacturing the silicon carbide semiconductor device, semiconductor substrate 16 having a very thin thickness of not more than 200 μm can be suppressed particularly effectively from being cracked.

(6) Preferably in the method for manufacturing the semiconductor device according to any one of (1) to (5), in the step of evacuating accommodation chamber 31, $H_2O$ partial pressure in accommodation chamber 31 is reduced to not more than $5 \times 10^{-4}$ Pa. Accordingly, water vapor in accommodation chamber 31 can be efficiently removed.

(7) Preferably in the method for manufacturing the semiconductor device according to any one of (1) to (6), in the step of evacuating accommodation chamber 31, the temperature of adhesive tape 1 is maintained at not less than 120° C. and not more than 200° C. By setting the temperature of adhesive tape 1 at not less than 120° C., water included in the adhesive tape efficiently can be removed. Moreover, by setting the temperature of adhesive tape 1 at not more than 200° C., the adhesive tape can be prevented from being deteriorated in quality.

(8) Preferably in the method for manufacturing the semiconductor device according to any one of (1) to (7), the semiconductor substrate includes silicon carbide. Silicon carbide is a material harder and weaker than silicon, and is more likely to be cracked particularly when the thickness thereof is small. According to the method for manufacturing the silicon carbide semiconductor device, semiconductor substrate 16, which include hard and weak silicon carbide, can be particularly effectively suppressed from being cracked.

(9) Preferably in the method for manufacturing the semiconductor device according to any one of (1) to (8), the step of forming electrode 15 includes steps of: forming a metal layer 14 on semiconductor substrate 16; and annealing metal layer 14. Accordingly, metal layer 14 is alloyed, thereby reducing contact resistance between semiconductor substrate 16 and electrode 15.

(10) Preferably in the method for manufacturing the semiconductor device according to (9), in the step of forming metal layer 14, $H_2O$ partial pressure in accommodation chamber 31 is reduced to not more than $1 \times 10^{-4}$ Pa. Accordingly, water vapor in accommodation chamber 31 can be efficiently removed.

(11) Preferably in the method for manufacturing the semiconductor device according to (10), the step of forming metal layer 14 is performed by a sputtering method. Accordingly, metal layer 14 can be produced with good precision.

(12) Preferably in the method for manufacturing the semiconductor device according to any one of (9) to (11), in the step of forming metal layer 14, metal layer 14 is formed while cooling semiconductor substrate 16. Accordingly, adhesive tape 1 having semiconductor substrate 16 fixed thereto is cooled, thereby suppressing generation of water vapor from adhesive tape 1.

(13) Preferably in the method for manufacturing the semiconductor device according to any one of (9) to (12), the step of forming metal layer 14 includes steps of: conveying semiconductor substrate 16 to a film formation chamber 32 provided to be coupled to accommodation chamber 31; and forming metal layer 14 on semiconductor substrate 16 in film formation chamber 32. By separating film formation chamber 32 and accommodation chamber 31, metal layer 14 can be more securely suppressed from being oxidized by water vapor generated from adhesive tape 1.

(14) Preferably in the method for manufacturing the semiconductor device according to any one of (9) to (13), in the step of forming metal layer 14, metal layer 14 is formed to have an in-plane film thickness distribution of less than 6%. By forming metal layer 14 small in in-plane film thickness distribution, variation in contact resistance can be reduced and yield of semiconductor devices can be improved.

[Details of Embodiments of the Invention of the Present Application]

First, the following describes a configuration of a MOSFET, which is an exemplary semiconductor device 100 manufactured by a manufacturing method according to one embodiment of the present invention.

With reference to FIG. 1, MOSFET 100 according to the embodiment mainly includes a substrate 10, an upper electrode structure 80, a drain electrode 15, and a backside surface protecting electrode 17. Substrate 10 is a silicon carbide substrate 10 composed of silicon carbide, for example. Silicon carbide substrate 10 has a base semiconductor substrate 11 and an epitaxial layer 20, for example. Base semiconductor substrate 11 is composed of hexagonal silicon carbide single crystal of polytype 4H, for example. Base semiconductor substrate 11 includes an impurity such as nitrogen, and has n type (first conductivity type) conductivity. Substrate 10 may be composed of a wide gap semiconductor having a larger band gap than that of silicon, for example. Substrate 10 may be GaN (gallium nitride) or diamond, for example.

Silicon carbide substrate 10 has a front surface 10a and a backside surface 10b opposite to front surface 10a. Front surface 10a of silicon carbide substrate 10 corresponds to, for example, a C (carbon) plane, i.e., a (000-1) plane, whereas backside surface 10b of silicon carbide substrate 10 corresponds to a Si (silicon) plane, i.e., a (0001) plane. Front surface 10a of silicon carbide substrate 10 may correspond to a plane angled off by about not more than 8° relative to the C plane, whereas backside surface 10b may correspond to a plane angled off by about not more than 8° relative to the Si plane. Moreover, front surface 10a of silicon carbide substrate 10 may correspond to the Si plane, and backside surface 10b of silicon carbide substrate 10 may correspond to the C plane. Front surface 10a of silicon carbide substrate 10 may correspond to a plane angled off by about not more than 8° relative to the Si plane, whereas backside surface 10b may correspond to a plane angled off by about not more than 8° relative to the C plane. Base semiconductor substrate 11 constitutes backside surface 10b of silicon carbide substrate 10, and epitaxial layer 20 constitutes front surface 10a of silicon carbide substrate 10.

Epitaxial layer 20 is provided on base semiconductor substrate 11 and is composed of silicon carbide, for example. Epitaxial layer 20 has a drift region 21, a body region 22, a source region 23, and a contact region 24. Drift region 21 includes an impurity such as nitrogen, and is a region having n type conductivity. The impurity concentration in drift region 21 is lower than the impurity concentration of base semiconductor substrate 11. Body region 22 has p type (second conductivity type) conductivity. Body region 22 includes an impurity such as Al (aluminum) or B (boron). The concentration of the impurity such as aluminum in body region 22 is, for example, $1\times10^{17}$ cm$^{-3}$.

Source region 23 has n type conductivity. Source region 23 is separated from drift region 21 by body region 22. Source region 23 constitutes a portion of front surface 10a of silicon carbide substrate 10, and is provided to be surrounded by body region 22. Source region 23 includes an impurity such as P (phosphorus), for example. The impurity concentration of source region 23 is higher than the impurity concentration of drift region 21. The concentration of the impurity such as phosphorus in source region 23 is, for example, $1\times10^{20}$ cm$^{-3}$.

Contact region 24 has p type conductivity. Contact region 24 is provided to extend through source region 23 and in contact with each of front surface 10a of silicon carbide substrate 10 and body region 22. Contact region 24 includes an impurity such as Al or B, for example. The impurity concentration of contact region 24 is higher than the impurity concentration of body region 22. The concentration of the impurity such as Al or B in contact region 24 is, for example, $1\times10^{20}$ cm$^{-3}$.

Upper electrode structure 80 mainly includes a gate oxide film 30, a gate electrode 40, a source electrode 50, an interlayer insulating film 60, a front surface protecting electrode 70, and a passivation film 90. Gate oxide film 30 is formed on front surface 10a of silicon carbide substrate 10 to extend from above the upper surface of one source region 23 to above the upper surface of the other source region 23. Gate oxide film 30 is formed in contact with each of source region 23, body region 22, and drift region 21. Gate oxide film 30 is composed of silicon dioxide, for example.

Gate electrode 40 is provided in contact with gate oxide film 30 so as to extend from above one source region 23 to above the other source region 23. Gate electrode 40 is provided in contact with gate oxide film 30 at a location facing each of source region 23, body region 22, and drift region 21. Gate electrode 40 is made of a conductor such as polysilicon having an impurity introduced therein or Al.

Source electrode 50 is provided in contact with source region 23 and contact region 24 at front surface 10a of silicon carbide substrate 10. Source electrode 50 is provided in contact with gate oxide film 30 so as to extend onto contact region 24 in a direction to separate from gate oxide film 30. Source electrode 50 is composed of, for example, a material including Ti, Al, and Si, and is in ohmic junction with source region 23 of silicon carbide substrate 10.

Interlayer insulating film 60 is provided in contact with gate electrode 40 and gate oxide film 30 to cover gate electrode 40. Interlayer insulating film 60 electrically insulates gate electrode 40 and source electrode 50. Front surface protecting electrode 70 is provided in contact with source electrode 50 to cover interlayer insulating film 60. The front surface protecting electrode is composed of a material including Al, for example. On front surface protecting electrode 70, passivation film 90 composed of silicon dioxide is provided, for example.

Drain electrode 15 is provided in contact with backside surface 10b of silicon carbide substrate 10. Drain electrode 15 is composed of a material including NiSi and is in ohmic junction with base semiconductor substrate 11, for example.

Drain electrode 15 is electrically connected to base semiconductor substrate 11. Backside surface protecting electrode 17 is formed in contact with the main surface of drain electrode 15 opposite to base semiconductor substrate 11. Backside surface protecting electrode 17 has a lamination structure including a Ti layer, a Pt layer, and a Au layer, for example. Backside surface protecting electrode 17 is electrically connected to drain electrode 15.

Next, the following describes a method for manufacturing the MOSFET according to one embodiment of the present invention.

Figure 2:
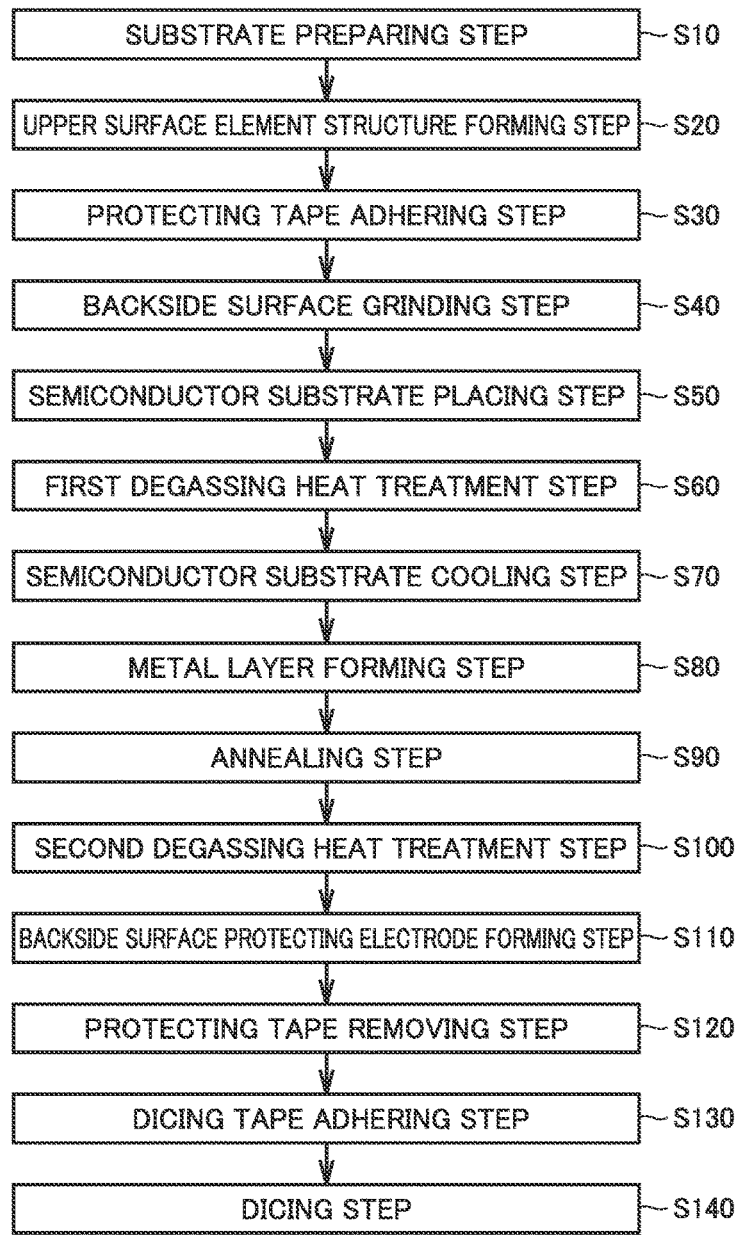
FIG. 2 is a flowchart schematically showing a method for manufacturing the semiconductor device according to the one embodiment of the present invention.
Figure 5:
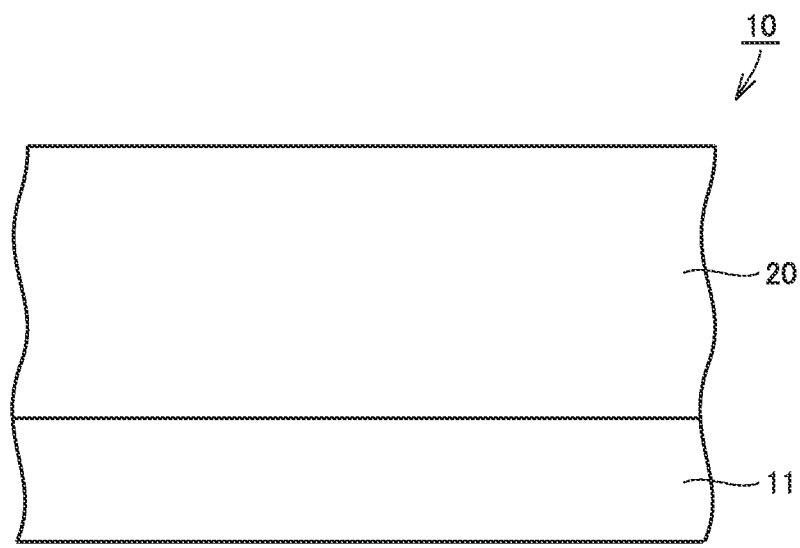
FIG. 5 is a schematic cross sectional view for schematically illustrating a first step of the method for manufacturing the semiconductor device according to the one embodiment of the present invention.

First, a substrate preparing step (S10: FIG. 2) is performed. Specifically, for example, an ingot (not shown) composed of silicon carbide single crystal having polytype 4H is sliced, thereby preparing base semiconductor substrate 11 composed of hexagonal silicon carbide single crystal and having n type conductivity. N type epitaxial layer 20 is formed on base semiconductor substrate 11 by epitaxial growth. Epitaxial layer 20 includes, for example, an impurity such as nitrogen ions. Front surface 10a of silicon carbide substrate 10 has a maximum diameter of not less than 100 mm, preferably not less than 150 mm, and more preferably not less than 200 mm. Front surface 10a of silicon carbide substrate 10 may correspond to a plane angled off by about not more than 8° relative to the (000-1) plane, or may correspond to a plane angled off by about not more than 8° relative to the (0001) plane (see FIG. 5), for example.

Next, an upper surface element structure forming step (S20: FIG. 2) is performed. The upper surface element structure is obtained by performing the following steps, for example.

Figure 4:
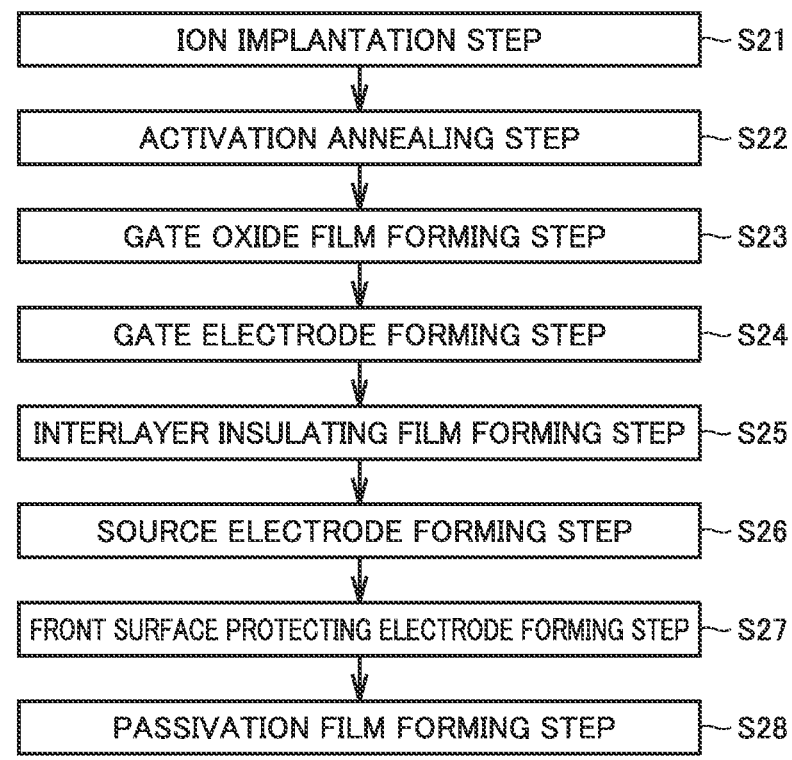
FIG. 4 is a flowchart schematically showing an upper surface element structure forming step of the method for manufacturing the semiconductor device according to the one embodiment of the present invention.
Figure 6:
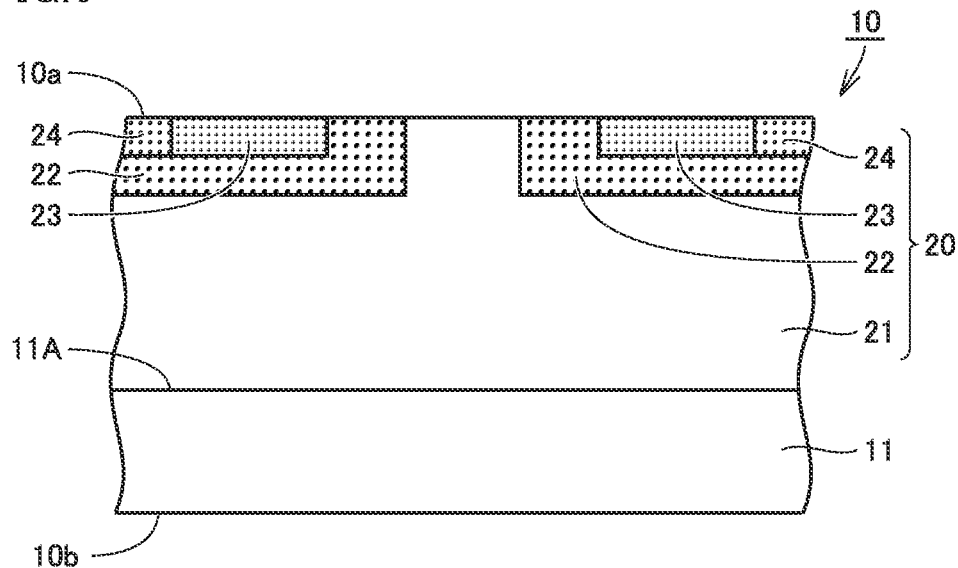
FIG. 6 is a schematic cross sectional view for schematically illustrating a second step of the method for manufacturing the semiconductor device according to the one embodiment of the present invention.

First, an ion implantation step (S21: FIG. 4) is performed. With reference to FIG. 6, first, for example, Al (aluminum) ions are implanted into front surface 10a of silicon carbide substrate 10, thereby forming body region 22 of p type conductivity in epitaxial layer 20. Next, for example, P (phosphorus) ions are implanted into body region 22 at a depth shallower than the depth in which the Al ions have been implanted, thereby forming source region 23 of n type conductivity. Next, for example, Al ions are further implanted into source region 23, thereby forming contact region 24 adjacent to source region 23, having the same depth as that of source region 23, and having p type conductivity. Further, in epitaxial layer 20, a region in which none of body region 22, source region 23, and contact region 24 is formed serves as drift region 21.

Next, an activation annealing step (S22: FIG. 4) is performed. Specifically, for example, silicon carbide substrate 10 is heated for about 30 minutes at a temperature of 1700° C., thereby activating the impurities implanted in the ion implantation step (S21: FIG. 4). Accordingly, desired carriers are generated in the regions having the impurities implanted therein.

Figure 7:
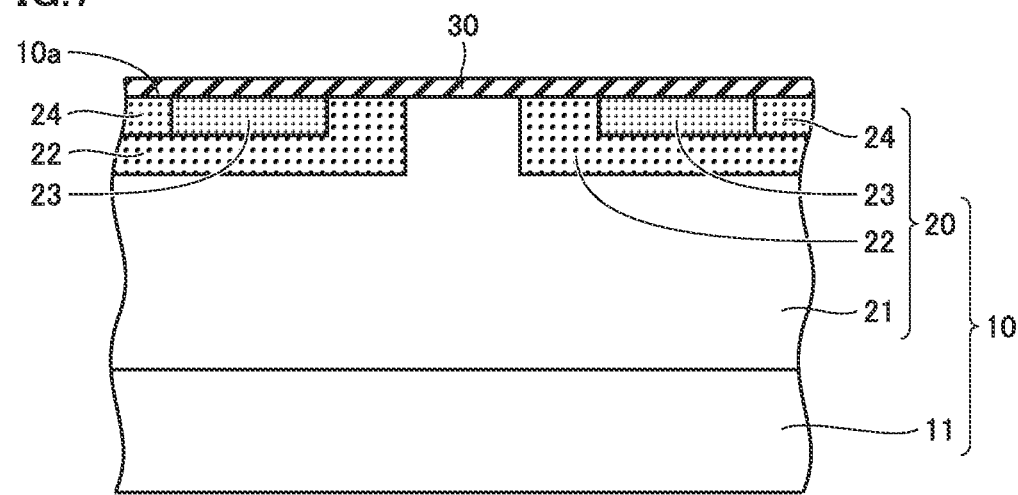
FIG. 7 is a schematic cross sectional view for schematically illustrating a third step of the method for manufacturing the semiconductor device according to the one embodiment of the present invention.

Next, a gate oxide film forming step (S23: FIG. 4) is performed. With reference to FIG. 7, for example, silicon carbide substrate 10 is heated in an atmosphere including oxygen, thereby forming gate oxide film 30 composed of silicon dioxide and in contact with front surface 10a of silicon carbide substrate 10. Silicon carbide substrate 10 is heated for about 60 minutes at a temperature of about 1300° C., for example. Gate oxide film 30 is formed on front surface 10a of silicon carbide substrate 10 in contact with each of drift region 21, body region 22, source region 23, and contact region 24.

Figure 8:
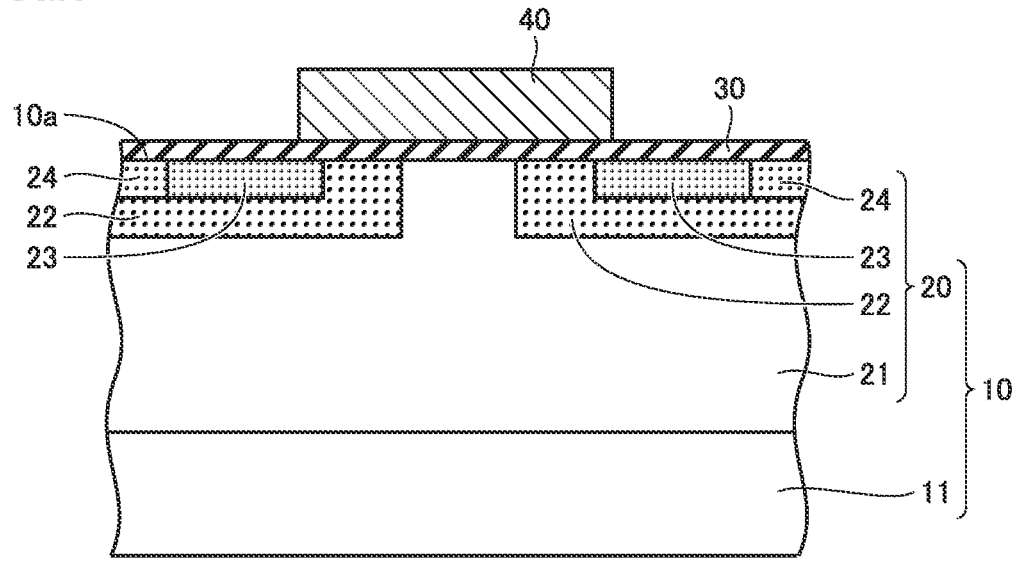
FIG. 8 is a schematic cross sectional view for schematically illustrating a fourth step of the method for manufacturing the semiconductor device according to the one embodiment of the present invention.

Next, a gate electrode forming step (S24: FIG. 4) is performed. With reference to FIG. 8, for example, an LPCVD (Low Pressure Chemical Vapor Deposition) method is employed to form, on gate oxide film 30, gate electrode 40 composed of polysilicon including an impurity. Gate electrode 40 is formed at a location facing each of source region 23, body region 22, and drift region 21 with gate oxide film 30 being interposed therebetween.

Figure 9:
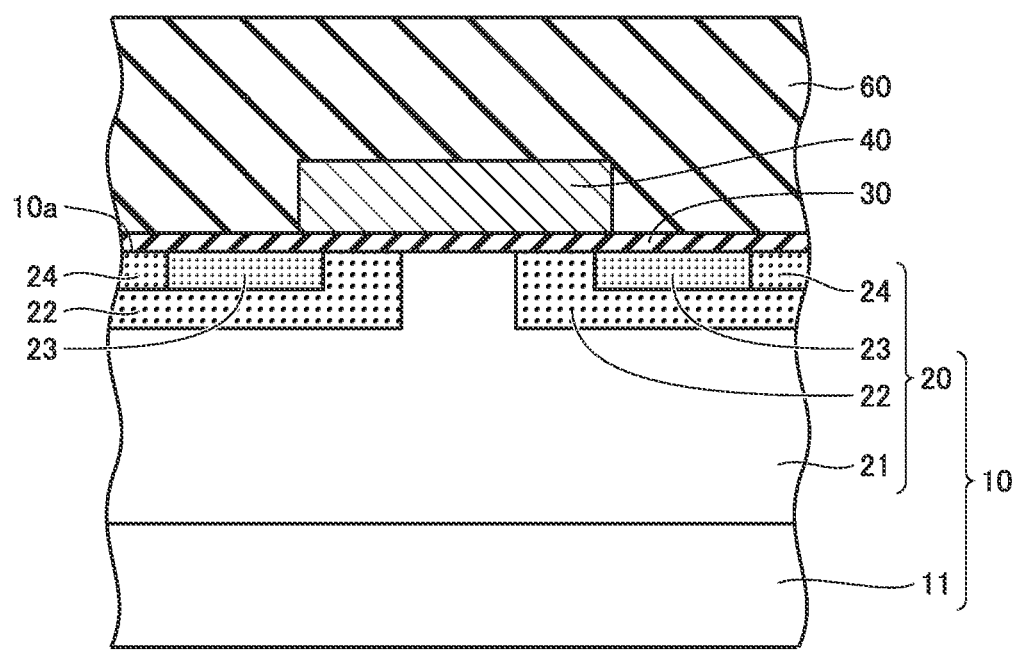
FIG. 9 is a schematic cross sectional view for schematically illustrating a fifth step of the method for manufacturing the semiconductor device according to the one embodiment of the present invention.

Next, an interlayer insulating film forming step (S25: FIG. 4) is performed. With reference to FIG. 9, for example, a plasma CVD method is employed to form interlayer insulating film 60 that covers gate electrode 40 and that is in contact with gate oxide film 30. Interlayer insulating film 60 is composed of silicon dioxide, for example.

Figure 10:
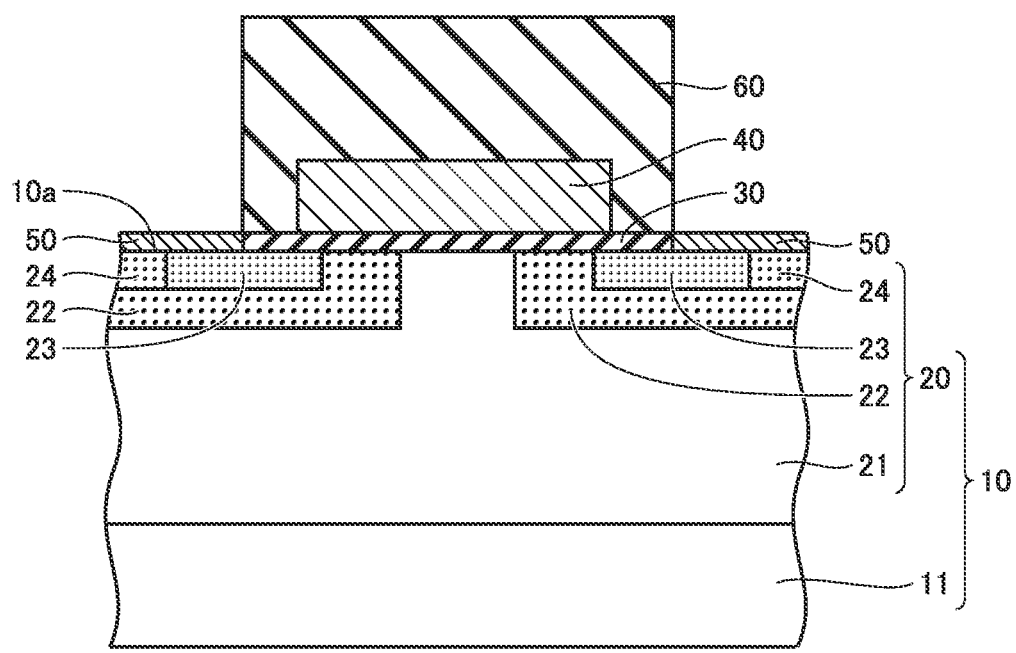
FIG. 10 is a schematic cross sectional view for schematically illustrating a sixth step of the method for manufacturing the semiconductor device according to the one embodiment of the present invention.

Next, a source electrode forming step (S26: FIG. 4) is performed. Specifically, for example, etching is performed to remove interlayer insulating film 60 and gate oxide film 30 from a region in which source electrode 50 is to be formed, thereby forming a region through which source region 23 and contact region 24 are exposed. Next, with reference to FIG. 10, by sputtering, a metal layer including NiSi (nickel silicon) or TiAlSi (titanium aluminum silicon) is formed on the region through which source region 23 and contact region 24 are exposed, for example. By heating the metal layer at, for example, about 1000° C., at least a portion of the metal layer is silicided, thereby forming source electrode 50 in ohmic junction with source region 23.

Next, a front surface protecting electrode forming step (S27: FIG. 4) is performed. Specifically, for example, the sputtering method is employed to form front surface protecting electrode 70 in contact with source electrode 50 so as to cover interlayer insulating film 60. Front surface protecting electrode 70 is composed of a material including aluminum, for example.

Figure 11:
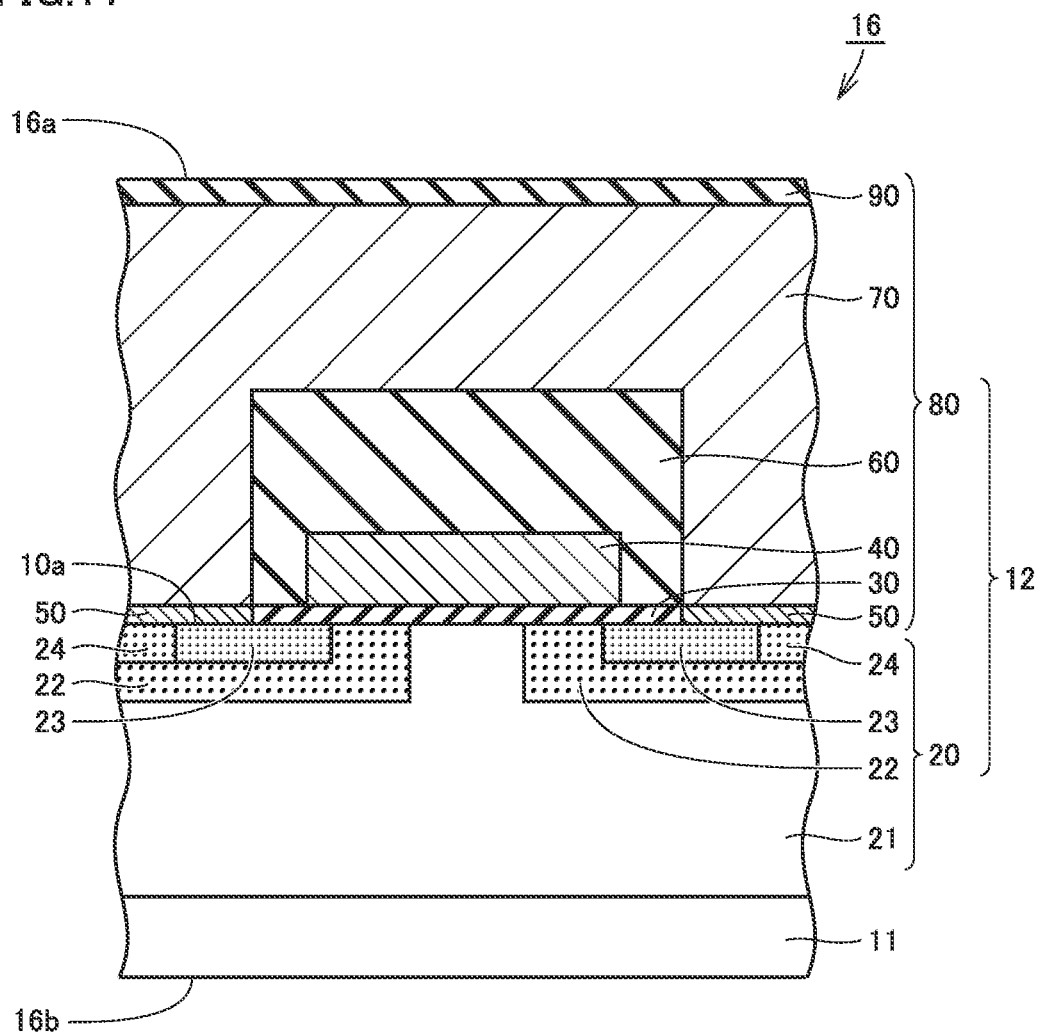
FIG. 11 is a schematic cross sectional view for schematically illustrating a seventh step of the method for manufacturing the semiconductor device according to the one embodiment of the present invention.

Next, a passivation film forming step (S28: FIG. 4) is performed. Specifically, for example, a CVD method is employed to form passivation film 90 to cover front surface protecting electrode 70. Passivation film 90 is composed of silicon dioxide, for example. In this way, the upper surface element forming step (S20: FIG. 2) is completed. Accordingly, semiconductor substrate 16 is prepared which has first main surface 16a and second main surface 16b opposite to first main surface 16a, first main surface 16a having a maximum diameter of not less than 100 mm. Semiconductor substrate 16 includes base semiconductor substrate 11 and an upper element structure 12. Upper element structure 12 includes epitaxial layer 20 and an upper electrode structure 80 (see FIG. 11). Preferably, semiconductor substrate 16 includes silicon carbide. At least one of base semiconductor substrate 11 and epitaxial layer 20 both constituting semiconductor substrate 16 may include GaN or diamond, for example.

Next, a protecting tape adhering step (S30: FIG. 2) is performed. First, adhesive tape 1 is prepared as a protecting tape. Adhesive tape 1 has a third main surface 1a and a fourth main surface 1b opposite to third main surface 1a. For example, adhesive tape 1 includes: an adhesive portion constituting third main surface 1a; and a base portion constituting fourth main surface 1b. As the adhesive portion, an acrylic adhesive agent having adhesiveness can be used, for example. As the base portion, an organic compound such as polyester can be used, for example. As the adhesive portion, there can be used a material having adhesive strength that is decreased when irradiated with energy rays such as ultraviolet rays. An ultraviolet curing type resin is an example of the material having adhesive strength that is decreased when irradiated with energy rays such as ultraviolet rays. Moreover, as the adhesive portion, a material having adhesive strength that is decreased when heated may be used. A heat curing type resin is an example of the material having adhesive strength that is decreased when heated.

Figure 12:
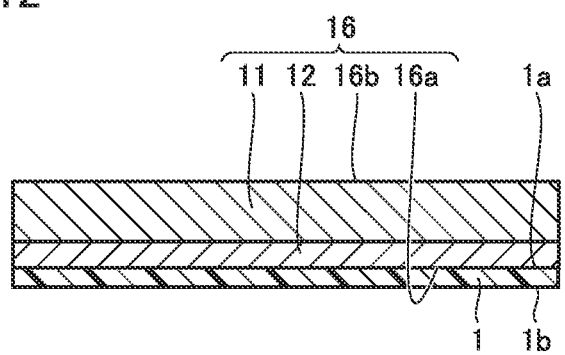
FIG. 12 is a schematic cross sectional view for schematically illustrating an eighth step of the method for manufacturing the semiconductor device according to the one embodiment of the present invention.
Figure 13:
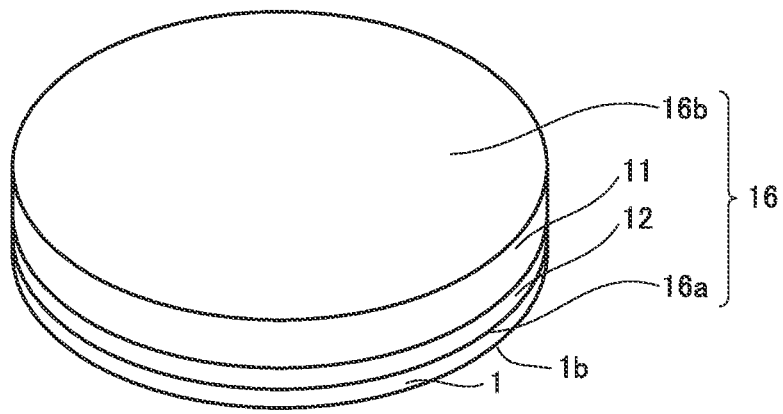
FIG. 13 is a perspective schematic view for schematically illustrating an eighth step of the method for manufacturing the semiconductor device according to the one embodiment of the present invention.

Next, with reference to FIG. 12 and FIG. 13, first main surface 16a of semiconductor substrate 16 at the upper element structure 12 side is adhered to third main surface 1a of adhesive tape 1, thereby supporting semiconductor substrate 16 by adhesive tape 1. Semiconductor substrate 16 is adhered to adhesive tape 1 such that first main surface 16a at the upper element structure 12 side is in contact with third main surface 1a of adhesive tape 1. In the manner described above, first main surface 16a of semiconductor substrate 16 is fixed to third main surface 1a of adhesive tape 1. It should be noted that third main surface 1a of adhesive tape 1 may be provided in contact with passivation film 90 of upper element structure 12 or may be provided in contact with front surface protecting electrode 70.

Figure 14:
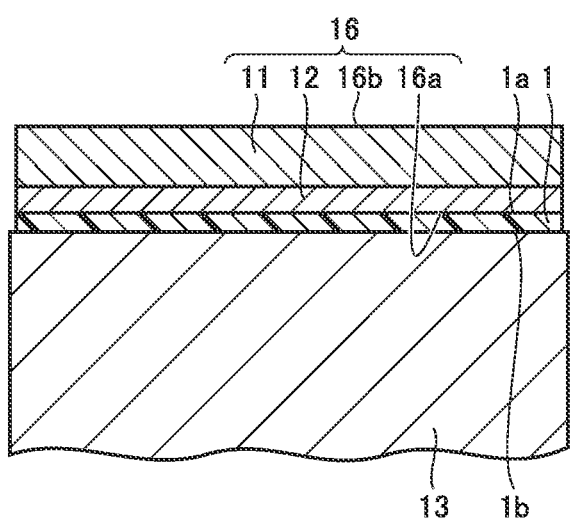
FIG. 14 is a schematic cross sectional view for schematically illustrating a ninth step of the method for manufacturing the semiconductor device according to the one embodiment of the present invention.
Figure 15:
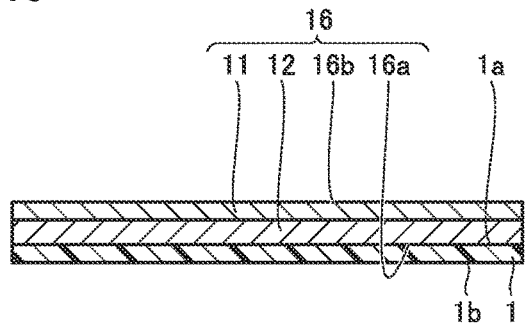
FIG. 15 is a schematic cross sectional view for schematically illustrating a tenth step of the method for manufacturing the semiconductor device according to the one embodiment of the present invention.

Next, a backside surface grinding step (S40: FIG. 2) is performed. Specifically, while supporting semiconductor substrate 16 by adhesive tape 1, second main surface 16b of semiconductor substrate 16 at the base semiconductor substrate 11 side is ground. With reference to FIG. 14, semiconductor substrate 16 is placed at substrate holding unit 13 such that fourth main surface 1b of adhesive tape 1 faces substrate holding unit 13. Next, second main surface 16b of semiconductor substrate 16 is ground by a grinding unit (not shown). With reference to FIG. 15, second main surface 16b of semiconductor substrate 16 is ground, thereby thinning base semiconductor substrate 11. Base semiconductor substrate 11 is ground from a thickness of 500 μm to a thickness of 200 μm, for example. Preferably, semiconductor substrate 16 is ground to a thickness of not more than 200 μm. In the step of grinding second main surface 16b of semiconductor substrate 16, second main surface 16b of semiconductor substrate 16 may be ground with each of semiconductor substrate 16 and adhesive tape 1 being immersed in grinding water.

Next, a silicon carbide semiconductor substrate placing step (S50: FIG. 2) is performed. Specifically, with reference to FIG. 23, semiconductor substrate 16 fixed to third main surface 1a of adhesive tape 1 is placed in an accommodation chamber 31. A vacuum pump is connected to accommodation chamber 31, and is provided to be capable of exhausting gas in accommodation chamber 31, for example.

Figure 3:
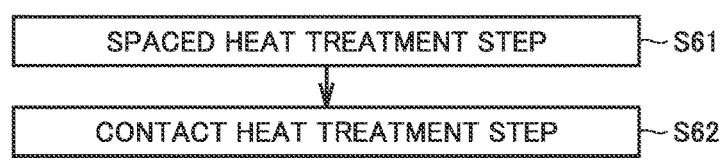
FIG. 3 is a flowchart schematically showing a first degassing heat treatment step in the method for manufacturing the semiconductor device according to the one embodiment of the present invention.

Next, a first degassing heat treatment step (S60: FIG. 2) is performed. The first degassing heat treatment step (S60: FIG. 2) includes a spaced heat treatment step (S61: FIG. 3) and a contact heat treatment step (S62: FIG. 3).

Figure 16:
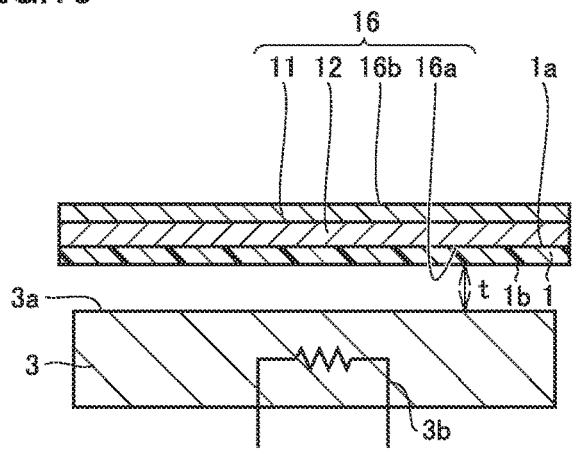
FIG. 16 is a schematic cross sectional view for schematically illustrating an eleventh step of the method for manufacturing the semiconductor device according to the one embodiment of the present invention.

First, the spaced heat treatment step (S61: FIG. 3) is performed. With reference to FIG. 16, semiconductor substrate 16 fixed to third main surface 1a of adhesive tape 1 is placed to face substrate holding surface 3a of substrate holding unit 3 with a space being provided between fourth main surface 1b of adhesive tape 1 and substrate holding unit 3. Substrate holding unit 3 includes heater 3b provided to be capable of heating semiconductor substrate 16 and adhesive tape 1. While maintaining the temperature of each of semiconductor substrate 16 and adhesive tape 1 at not less than 100° C. by operating heater 3b with the space being provided between fourth main surface 1b of adhesive tape 1 and substrate holding unit 3, accommodation chamber 31 is evacuated. Space t is about 1 mm, for example. Preferably, space t is maintained at about not less than 0.5 mm and not more than 2.0 mm. Specifically, for example, while heating adhesive tape 1 and semiconductor substrate 16 at not less than 100° C. by heater 3b provided in substrate holding unit 3, accommodation chamber 31 is evacuated, thereby exhausting gas in accommodation chamber 31. Preferably, $H_2O$ partial pressure in the accommodation chamber is reduced to not more than $5\times10^{-4}$ Pa, and is more preferably reduced to not more than $1.5\times10^{-4}$ Pa. Accordingly, water included in adhesive tape 1 is removed. The temperature of each of adhesive tape 1 and semiconductor substrate 16 is preferably maintained at not less than 120° C. and not more than 200° C., is more preferably maintained at not less than 140° C. and not more than 180° C., and is further preferably maintained at not less than 150° C. and not more than 170° C.

Figure 17:
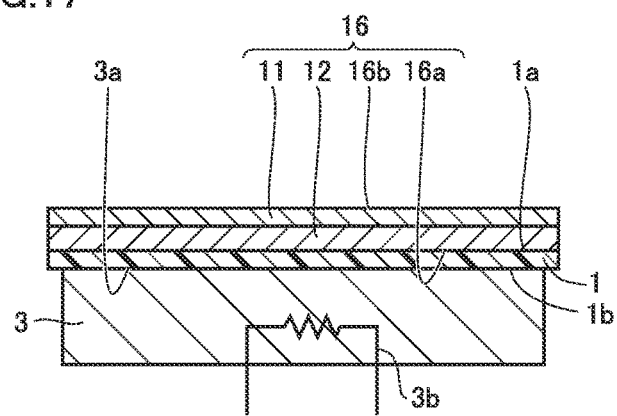
FIG. 17 is a schematic cross sectional view for schematically illustrating a twelfth step of the method for manufacturing the semiconductor device according to the one embodiment of the present invention.

Next, the contact heat treatment step (S62: FIG. 3) is performed. Specifically, with reference to FIG. 17, semiconductor substrate 16 fixed to third main surface 1a of adhesive tape 1 is placed to face substrate holding surface 3a of substrate holding unit 3 such that fourth main surface 1b of adhesive tape 1 is in contact with substrate holding surface 3a of substrate holding unit 3. Semiconductor substrate 16 is fixed to substrate holding surface 3a of substrate holding unit 3 by electrostatic adsorption with adhesive tape 1 interposed therebetween, for example. In the spaced heat treatment step (S61: FIG. 3), most of water vapor between third main surface 1a of adhesive tape 1 and first main surface 16a of semiconductor substrate 16 has been removed. By adsorbing semiconductor substrate 16 to substrate holding surface 3a of substrate holding unit 3 with adhesive tape 1 interposed therebetween, adhesive tape 1 is pressed from both the semiconductor substrate 16 side and the substrate holding unit 3 side. Accordingly, remaining water vapor between third main surface 1a of adhesive tape 1 and first main surfaces 16a of semiconductor substrate 16 is exhausted from between third main surface 1a of adhesive tape 1 and first main surfaces 16a of semiconductor substrate 16. While maintaining the temperature of each of semiconductor substrate 16 and adhesive tape 1 at not less than 100° C. by operating heater 3b with fourth main surface 1b of adhesive tape 1 being adsorbed to substrate holding surface 3a of substrate holding unit 3, accommodation chamber 31 is evacuated. For example, while heating adhesive tape 1 and semiconductor substrate 16 at not less than 100° C. by heater 3b provided in substrate holding unit 3, accommodation chamber 31 is evacuated, thereby exhausting gas in accommodation chamber 31. Preferably, $H_2O$ partial pressure in the accommodation chamber is reduced to not more than $5\times10^{-4}$ Pa, and is more preferably reduced to not more than $1.5\times10^{-4}$ Pa. The temperature of each of adhesive tape 1 and semiconductor substrate 16 is preferably maintained at not less than 120° C. and not more than 200° C., is more preferably maintained at not less than 140° C. and not more than 180° C., and is further preferably maintained at not less than 150° C. and not more than 170° C.

Next, a silicon carbide semiconductor substrate cooling step (S70: FIG. 2) is performed. Specifically, after the step of evacuating accommodation chamber 31 while maintaining semiconductor substrate 16 and adhesive tape 1 at not less than 100° C., the heating of semiconductor substrate 16 and adhesive tape 1 is stopped to reduce the temperature of each of semiconductor substrate 16 and adhesive tape 1 from the temperature of not less than 100° C. to a room temperature. Semiconductor substrate 16 and adhesive tape 1 may be cooled forcibly by a cooling mechanism (not shown) or may be cooled by self-cooling.

Next, a reverse sputtering step may be performed. In the reverse sputtering step, a portion of second main surface 16b of semiconductor substrate 16 is removed. Specifically, in an Ar atmosphere of 10 Pa, reverse sputtering is performed onto second main surface 16b of semiconductor substrate 16 under application of RF power of 800 W.

Figure 18:
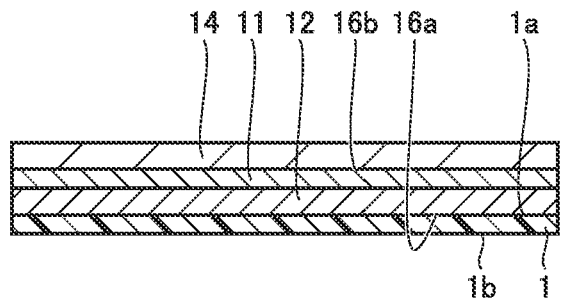
FIG. 18 is a schematic cross sectional view for schematically illustrating a thirteenth step of the method for manufacturing the semiconductor device according to the one embodiment of the present invention.
Figure 21:
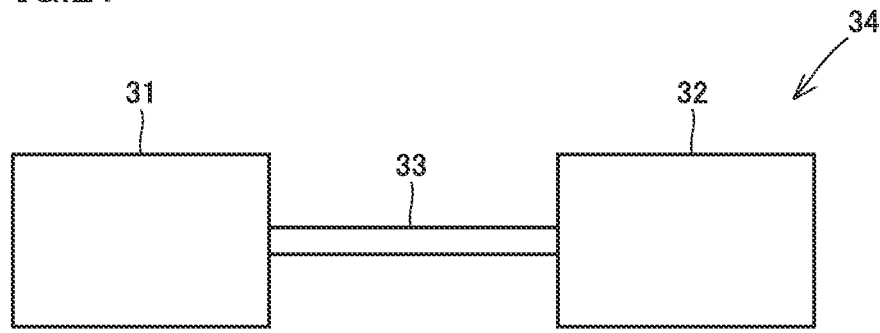
FIG. 21 is a schematic view schematically showing a configuration of a manufacturing apparatus for the silicon carbide semiconductor device according to the one embodiment of the present invention.

Next, a step of forming the drain electrode is performed. The step of forming the drain electrode includes a metal layer forming step (S80: FIG. 2) and an annealing step (S90: FIG. 2). First, the metal layer forming step (S80: FIG. 2) is performed. With reference to FIG. 18, semiconductor substrate 16 is moved from accommodation chamber 31 of film forming apparatus 34 to film formation chamber 32 provided to be coupled to accommodation chamber 31 via a coupling portion 33. It should be noted that semiconductor substrate 16 is preferably moved from accommodation chamber 31 to film formation chamber 32 via coupling portion 33 with accommodation chamber 31, coupling portion 33, and film formation chamber 32 being evacuated. With reference to FIG. 21, $H_2O$ partial pressure in accommodation chamber 31 or film formation chamber 32 in which semiconductor substrate 16 is placed is reduced to not more than $1\times10^{-4}$ Pa. For example, metal layer 14 composed of NiSi is formed on second main surface 16b of semiconductor substrate 16 with semiconductor substrate 16 being supported by adhesive tape 1. It should be noted that metal layer 14 may be TiAlSi or the like, for example. Metal layer 14 is preferably formed by the sputtering method. Metal layer 14 may be formed by a deposition method. Preferably, metal layer 14 is formed while cooling semiconductor substrate 16. In-plane film thickness distribution of metal layer 14 is preferably less than 6%, is more preferably not more than 5%, and is further preferably not more than 3.5%. It should be noted that the in-plane film thickness distribution of the metal layer refers to a percentage value calculated by dividing a difference between the maximum film thickness and minimum film thickness of the metal layer by an average film thickness.

Figure 19:
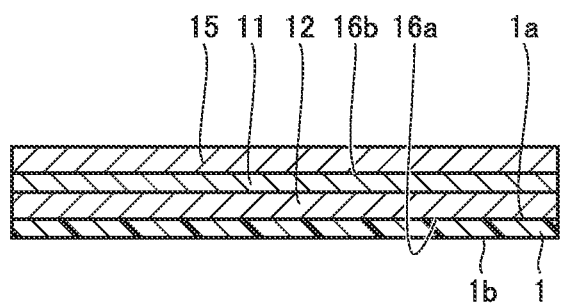
FIG. 19 is a schematic cross sectional view for schematically illustrating a fourteenth step of the method for manufacturing the semiconductor device according to the one embodiment of the present invention.

Next, the annealing step (S90: FIG. 2) is performed. By heating metal layer 14 formed in contact with second main surface 16b of semiconductor substrate 16, metal layer 14 is alloyed into drain electrode 15. For example, by locally heating metal layer 14 by way of laser irradiation, at least a portion of metal layer 14 is silicided. Accordingly, drain electrode 15 is formed in ohmic junction with base semiconductor substrate 11 of semiconductor substrate 16. The in-plane film thickness distribution of drain electrode 15 is preferably less than 6%, is more preferably not more than 5%, and is further preferably not more than 3.5%. By employing the laser irradiation as a method for heating metal layer 14, metal layer 14 can be more readily locally heated while suppressing increase of the temperature in a region adjacent to metal layer 14. As described above, drain electrode 15 is formed on second main surface 16b of semiconductor substrate 16 (see FIG. 19).

Next, a second degassing heat treatment step (S100: FIG. 2) may be performed. In the second degassing heat treatment step (S100: FIG. 2), the spaced heat treatment step (S61: FIG. 3) and contact heat treatment step (S62: FIG. 3) mentioned above are performed. In the annealing step, once semiconductor substrate 16 is exposed to atmospheric pressure air from a vacuum state, water may be adhered to adhesive tape 1 again. In view of this, the second degassing heat treatment step is performed before a backside surface protecting electrode forming step to be performed next, whereby water adhered to adhesive tape 1 again can be removed and adhesion between drain electrode 15 and backside surface protecting electrode 17 can be accordingly improved.

Figure 20:
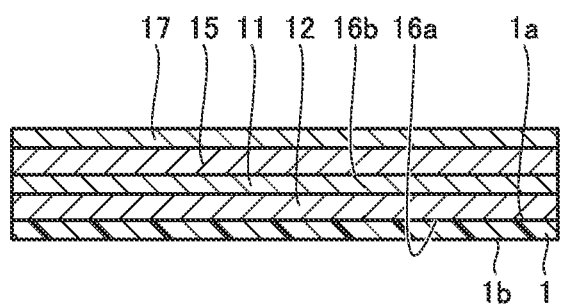
FIG. 20 is a schematic cross sectional view for schematically illustrating a fifteenth step of the method for manufacturing the semiconductor device according to the one embodiment of the present invention.

Next, the backside surface protecting electrode forming step (S110: FIG. 2) is performed. With reference to FIG. 20, backside surface protecting electrode 17 in contact with drain electrode 15 is formed with semiconductor substrate 16 being supported by adhesive tape 1. Backside surface protecting electrode 17 is composed of Ti/Pt/Au, for example. Specifically, first, by sputtering, a first electrode layer (not shown) composed of Ti, TiN, TiW, or NiCr is formed on and in contact with drain electrode 15, for example. Next, similarly, by sputtering, a second electrode layer (not shown) composed of Pt or Ni is formed on the first electrode layer. Then, similarly, by sputtering, a third electrode layer (not shown) composed of Au or Ag is formed on the second electrode layer. In this way, backside surface protecting electrode 17 having the lamination structure including the electrode layers is formed on drain electrode 15.

Next, a protecting tape removing step (S120: FIG. 2) is performed. Specifically, adhesive tape 1 serving as a protecting tape is removed from first main surface 16a of semiconductor substrate 16. Next, a dicing tape adhering step (S130: FIG. 2) is performed. Specifically, a new adhesive tape 1 is adhered to cover the surface of backside surface protecting electrode 17 opposite to drain electrode 15. Next, a dicing step (S140: FIG. 2) is performed. Semiconductor substrate 16 is cut in a thickness direction with semiconductor substrate 16 being supported by adhesive tape 1, thereby obtaining a plurality of MOSFETs 100. Semiconductor substrate 16 may be cut by laser dicing or scribing, for example.

It should be noted that in the above embodiment, a MOSFET may be manufactured in which n type and p type are replaced with each other. Moreover, in the description above, the planer type MOSFET has been described as an exemplary semiconductor device; however, the present invention is not limited to this. The semiconductor device may be a trench type MOSFET, an IGBT (Insulated Gate Bipolar Transistor), or the like, for example.

Next, the following describes function and effect of the method for manufacturing the MOSFET according to the present embodiment.

According to the method for manufacturing MOSFET 100 according to the present embodiment, semiconductor substrate 16 fixed to third main surface 1a of adhesive tape 1 is placed in accommodation chamber 31, and accommodation chamber 31 is evacuated while maintaining the temperature of adhesive tape 1 at not less than 100° C. Accordingly, water contained in or adhered to adhesive tape 1 is vaporized into water vapor and the water vapor is exhausted from accommodation chamber 31, thereby removing the water vapor around semiconductor substrate 16. In this way, drain electrode 15 formed on semiconductor substrate 16 can be suppressed from being oxidized by the water vapor. As a result, contact resistance between semiconductor substrate 16 and drain electrode 15 can be reduced. Moreover, in the step of evacuating accommodation chamber 31, accommodation chamber 31 is evacuated while maintaining the temperature of adhesive tape 1 at not less than 100° C. with a space being provided between fourth main surface 1b of adhesive tape 1 and substrate holding unit 3. Hence, the water vapor can be exhausted from between first main surface 16a of semiconductor substrate 16 and third main surfaces 1a of adhesive tape 1 without deforming semiconductor substrate 16 greatly. As a result, semiconductor substrate 16 can be suppressed from being cracked.

Moreover, according to the method for manufacturing MOSFET 100 according to the present embodiment, the step of evacuating accommodation chamber 31 includes a step of evacuating accommodation chamber 31 while maintaining the temperature of adhesive tape 1 at not less than 100° C. with fourth main surface 1b of adhesive tape 1 being in contact with substrate holding unit 3, after the step of evacuating accommodation chamber 31 while maintaining the temperature of adhesive tape 1 at not less than 100° C. with the space being provided between fourth main surface 1b of adhesive tape 1 and substrate holding unit 3. Accordingly, adhesive tape 1 is heated while being pressed by semiconductor substrate 16, thereby effectively removing water vapor remaining between first main surface 16a of semiconductor substrate 16 and third main surface 1a of adhesive tape 1.

According to the method for manufacturing MOSFET 100 according to the present embodiment, substrate holding unit 3 includes a heater 3b provided to be capable of heating each of semiconductor substrate 16 and adhesive tape 1. Space t is maintained at not less than 0.5 mm and not more than 2.0 mm in the step of evacuating accommodation chamber 31 while maintaining the temperature of adhesive tape 1 at not less than 100° C. with the space being provided between fourth main surface 1b of adhesive tape 1 and substrate holding unit 3. When space t is not less than 0.5 mm, adhesive tape 1 is sufficiently deformed, so that water on first main surface 16a of semiconductor substrate 16 and third main surface 1a of adhesive tape 1 can be effectively removed. Moreover, when space t is not more than 2.0 mm, the temperature of each of adhesive tape 1 and semiconductor substrate 16 can be increased to a temperature at which water can be vaporized.

Furthermore, the method for manufacturing MOSFET 100 according to the present embodiment further includes a step of grinding second main surface 16b of semiconductor substrate 16 after the step of fixing first main surface 16a of semiconductor substrate 16 to third main surface 1a of adhesive tape 1 and before the step of evacuating accommodation chamber 31 while maintaining the temperature of adhesive tape 1 at not less than 100° C. Accordingly, semiconductor substrate 16 can be reduced to a desired thickness.

Further, according to the method for manufacturing MOSFET 100 according to the present embodiment, in the step of grinding second main surface 16b of semiconductor substrate 16, semiconductor substrate 16 is ground until semiconductor substrate 16 has a thickness of not more than 200 μm. When the thickness of semiconductor substrate 16 is small, semiconductor substrate 16 is particularly likely to be cracked. According to the method for manufacturing the silicon carbide semiconductor device, semiconductor substrate 16 having a very thin thickness of not more than 200 μm can be suppressed particularly effectively from being cracked.

Further, according to the method for manufacturing MOSFET 100 according to the present embodiment, in the step of evacuating accommodation chamber 31, $H_2O$ partial pressure in accommodation chamber 31 is reduced to not more than $5 \times 10^{-4}$ Pa. Accordingly, water vapor in accommodation chamber 31 can be efficiently removed.

Further, according to the method for manufacturing MOSFET 100 according to the present embodiment, in the step of evacuating accommodation chamber 31, the temperature of adhesive tape 1 is maintained at not less than 120° C. and not more than 200° C. By setting the temperature of adhesive tape 1 at not less than 120° C., water included in the adhesive tape can be removed efficiently. Moreover, by setting the temperature of adhesive tape 1 at not more than 200° C., the adhesive tape can be prevented from being deteriorated in quality.

Further, according to the method for manufacturing MOSFET 100 according to the present embodiment, the semiconductor substrate includes silicon carbide. Silicon carbide is a material harder and weaker than silicon, and is more likely to be cracked particularly when the thickness thereof is small. According to the method for manufacturing the silicon carbide semiconductor device, semiconductor substrate 16, which include hard and weak silicon carbide, can be particularly effectively suppressed from being cracked.

Further, according to the method for manufacturing MOSFET 100 according to the present embodiment, the step of forming drain electrode 15 includes steps of: forming a metal layer 14 on semiconductor substrate 16; and annealing metal layer 14. Accordingly, metal layer 14 is alloyed, thereby reducing contact resistance between semiconductor substrate 16 and drain electrode 15.

Further, according to the method for manufacturing MOSFET 100 according to the present embodiment, in the step of forming metal layer 14, $H_2O$ partial pressure in accommodation chamber 31 is reduced to not more than $1 \times 10^{-4}$ Pa. Accordingly, water vapor in accommodation chamber 31 can be efficiently removed.

Further, according to the method for manufacturing MOSFET 100 according to the present embodiment, the step of forming metal layer 14 is performed by a sputtering method. Accordingly, metal layer 14 can be produced with good precision.

Further, according to the method for manufacturing MOSFET 100 according to the present embodiment, in the step of forming metal layer 14, metal layer 14 is formed while cooling semiconductor substrate 16. Accordingly, adhesive tape 1 having semiconductor substrate 16 fixed thereto is cooled, thereby suppressing generation of water vapor from adhesive tape 1.

Further, according to the method for manufacturing MOSFET 100 according to the present embodiment, the step of forming metal layer 14 includes steps of: conveying semiconductor substrate 16 to a film formation chamber 32 provided to be coupled to accommodation chamber 31; and forming metal layer 14 on semiconductor substrate 16 in film formation chamber 32. By separating film formation chamber 32 and accommodation chamber 31, metal layer 14 can be more securely suppressed from being oxidized by water vapor generated from adhesive tape 1.

Further, according to the method for manufacturing MOSFET 100 according to the present embodiment, in the step of forming metal layer 14, metal layer 14 is formed to have an in-plane film thickness distribution of less than 6%. By forming metal layer 14 small in in-plane film thickness distribution, variation in contact resistance can be reduced and yield of semiconductor devices can be improved.

[Example]

In the present example, inspection was performed with regard to a relation between (i) space t between a stage 3 serving as substrate holding unit 3 and adhesive tape 1 and (ii) the temperature of second main surface 16*b* of semiconductor substrate 16.

First, with reference to FIG. 16, semiconductor substrate 16 fixed to third main surface 1*a* of adhesive tape 1 was placed to face substrate holding surface 3*a* of stage 3 with a space being provided between fourth main surface 1*b* of adhesive tape 1 and stage 3 serving as substrate holding unit 3. By operating heater 3*b*, semiconductor substrate 16 fixed to third main surface 1*a* of adhesive tape 1 was heated. Space t between substrate holding surface 3*a* of stage 3 serving as substrate holding unit 3 and fourth main surfaces 1*b* of adhesive tape 1 was set at 1.0 mm, 1.5 mm, and 2.0 mm. The temperature of second main surface 16*b* of semiconductor substrate 16 was measured with each of the above-described spaces interposed therebetween. The temperature of second main surface 16*b* of semiconductor substrate 16 was measured every one minute for 10 minutes.

Figure 24:
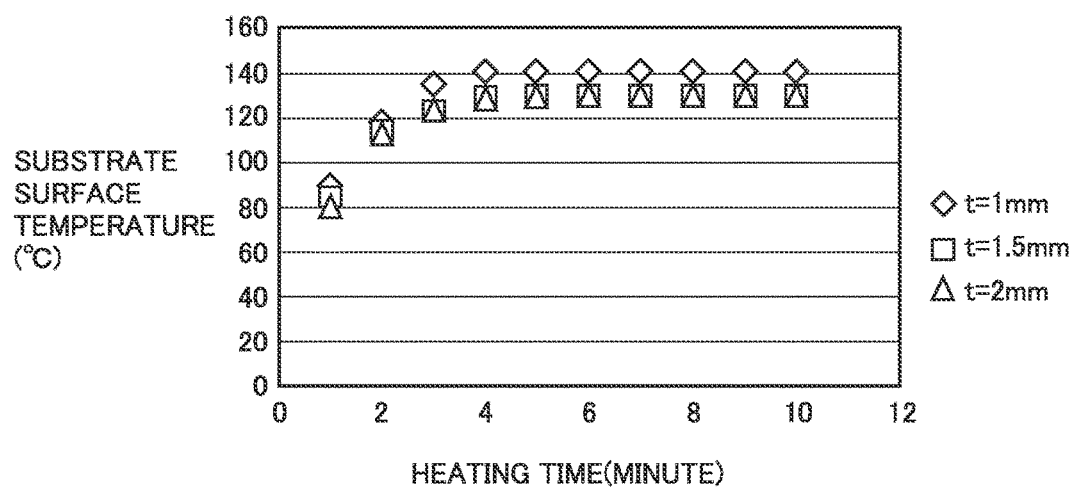
FIG. 24 presents data indicating a relation between temperature of the semiconductor substrate and heating time when changing the space between the substrate holding unit and the adhesive tape.

With reference to FIG. 24, the following describes a relation between the temperature of second main surface 16*b* of semiconductor substrate 16 and the heating time of semiconductor substrate 16. In the case where space t was 1.0 mm, the temperature of semiconductor substrate 16 was 90° C. for a heating time of 1 minute, 118° C. for a heating time of 2 minutes, 135° C. for a heating time of 3 minutes, and 140° C. for a heating time of 4 minutes. The temperature of semiconductor substrate 16 was constant at 140° C. after the heating time of 4 minutes. In the case where space t was 1.5 mm, the temperature of semiconductor substrate 16 was 85° C. for a heating time of 1 minute, 115° C. for a heating time of 2 minutes, 123° C. for a heating time of 3 minutes, and 129° C. for a heating time of 4 minutes. The temperature of semiconductor substrate 16 was constant at 130° C. after a heating time of 5 minutes. In the case where space t was 2.0 mm, the temperature of semiconductor substrate 16 was 80° C. for a heating time of 1 minute, 113° C. for a heating time of 2 minutes, 122° C. for a heating time of 3 minutes, and 130° C. for a heating time of 4 minutes. The temperature of semiconductor substrate 16 was constant at 130° C. after the heating time of 4 minutes.

In view of the above result, in the case where space t between stage 3 serving as substrate holding unit 3 and fourth main surface 1*b* of adhesive tape 1 was 1.0 mm, the temperature of semiconductor substrate 16 was increased more quickly and the final temperature was higher than those in the cases where space t was 1.5 mm and 2.0 mm. In the case where space t between stage 3 serving as substrate holding unit 3 and fourth main surface 1*b* of adhesive tape 1 was 1.5 mm, the temperature of semiconductor substrate 16 is increased more quickly than that in the case where space t was 2.0 mm but the final temperature was comparable to that in the case where space t was 2.0 mm.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: adhesive tape; 1*a*: third main surface; 1*b*: fourth main surface; 3: substrate holding unit (stage); 3*a*: substrate holding surface; 3*b*: heater; 10: substrate (silicon carbide substrate); 10*a*: front surface; 10*b*: backside surface; 11: base semiconductor substrate; 12: upper element structure; 13: substrate holding unit; 14: metal layer; 15: electrode (drain electrode); 16: semiconductor substrate; 16*a*: first main surface; 16*b*: second main surface; 17: backside surface protecting electrode; 20: epitaxial layer; 21: drift region; 22: body region; 23: source region; 24: contact region; 30: gate oxide film; 31: accommodation chamber; 32: film formation chamber; 33: coupling portion; 34: film forming apparatus; 40: gate electrode; 50: source electrode; 60: interlayer insulating film; 70: front surface protecting electrode; 80: upper electrode structure; 90: passivation film; 100: semiconductor device (MOSFET); G: gas; t: space

The invention claimed is:

1. A method for manufacturing a semiconductor device comprising steps of:

preparing a semiconductor substrate, an adhesive tape, and a substrate holding unit, the semiconductor substrate having a first main surface and a second main surface opposite to the first main surface, the first main surface having a maximum diameter of not less than 100 mm, the adhesive tape having a third main surface and a fourth main surface opposite to the third main surface, the substrate holding unit being provided to be capable of holding the semiconductor substrate;

fixing the first main surface of the semiconductor substrate to the third main surface of the adhesive tape;

placing, in an accommodation chamber, the semiconductor substrate fixed to the third main surface of the adhesive tape;

evacuating the accommodation chamber while maintaining a temperature of the adhesive tape at not less than 100° C.;

reducing a temperature of the semiconductor substrate after the step of evacuating the accommodation chamber; and forming an electrode on the second main surface of the semiconductor substrate after the step of reducing the temperature of the semiconductor substrate, the step of evacuating the accommodation chamber including a step of evacuating the accommodation chamber while maintaining the temperature of the adhesive tape at not less than 100° C. with a space being provided between the fourth main surface of the adhesive tape and the substrate holding unit.

2. The method for manufacturing the semiconductor device according to claim 1, wherein the step of evacuating the accommodation chamber includes a step of evacuating the accommodation chamber while maintaining the temperature of the adhesive tape at not less than 100° C. with the fourth main surface of the adhesive tape being in contact with the substrate holding unit, after the step of evacuating the accommodation chamber while maintaining the temperature of the adhesive tape at not less than 100° C. with the space being provided between the fourth main surface of the adhesive tape and the substrate holding unit.

3. The method for manufacturing the semiconductor device according to claim 1, wherein the substrate holding unit includes a heater provided to be capable of heating each of the semiconductor substrate and the adhesive tape, and the space is maintained at not less than 0.5 mm and not more than 2.0 mm in the step of evacuating the accommodation chamber while maintaining the temperature of the adhesive tape at not less than 100° C. with the space being provided between the fourth main surface of the adhesive tape and the substrate holding unit.

4. The method for manufacturing the semiconductor device according to claim 1, further comprising a step of grinding the second main surface of the semiconductor substrate after the step of fixing the first main surface of the semiconductor substrate to the third main surface of the adhesive tape and before the step of evacuating the accommodation chamber while maintaining the temperature of the adhesive tape at not less than 100° C.

5. The method for manufacturing the semiconductor device according to claim 4, wherein in the step of grinding the second main surface of the semiconductor substrate, the semiconductor substrate is ground until the semiconductor substrate has a thickness of not more than 200 μm.

6. The method for manufacturing the semiconductor device according to claim 1, wherein in the step of evacuating the accommodation chamber, $H_2O$ partial pressure in the accommodation chamber is reduced to not more than $5 \times 10^{-4}$ Pa.

7. The method for manufacturing the semiconductor device according to claim 1, wherein in the step of evacuating the accommodation chamber, the temperature of the adhesive tape is maintained at not less than 120° C. and not more than 200° C.

8. The method for manufacturing the semiconductor device according to claim 1, wherein the semiconductor substrate includes silicon carbide.

9. The method for manufacturing the semiconductor device according to claim 1, wherein the step of forming the electrode includes steps of:

forming a metal layer on the semiconductor substrate; and
annealing the metal layer.

10. The method for manufacturing the semiconductor device according to claim 9, wherein in the step of forming the metal layer, $H_2O$ partial pressure in the accommodation chamber is reduced to not more than $1 \times 10^{-4}$ Pa.

11. The method for manufacturing the semiconductor device according to claim 9, wherein the step of forming the metal layer is performed by a sputtering method.

12. The method for manufacturing the semiconductor device according to claim 9, wherein in the step of forming the metal layer, the metal layer is formed while cooling the semiconductor substrate.

13. The method for manufacturing the semiconductor device according to claim 9, wherein the step of forming the metal layer includes steps of: conveying the semiconductor substrate to a film formation chamber provided to be coupled to the accommodation chamber; and forming the metal layer on the semiconductor substrate in the film formation chamber.

14. The method for manufacturing the semiconductor device according to claim 9, wherein in the step of forming the metal layer, the metal layer is formed to have an in-plane film thickness distribution of less than 6%.

* * * * *